United States Patent [19]
Bruges

[11] Patent Number: 5,120,919
[45] Date of Patent: Jun. 9, 1992

[54] CABINET FOR A MACHINE COOLED BY VENTILATION

[75] Inventor: Jean-Claude Bruges, Bouchemaine, France

[73] Assignee: Bull, S.A., France

[21] Appl. No.: 456,387

[22] Filed: Dec. 26, 1989

[30] Foreign Application Priority Data

Dec. 27, 1988 [FR] France ............... 88 17207

[51] Int. Cl.$^5$ .................. H05K 7/20; B01D 46/42
[52] U.S. Cl. .................... 200/289; 55/274;
  55/350; 165/40; 200/61.42; 340/568; 340/607;
  361/384
[58] Field of Search ............ 340/568, 571, 607;
  361/384, 379, 212, 383, 220, 390; 200/289,
  302.1, 309, 332, 81.9 R, 61.41, 61.42, 61.43;
  98/28; 174/16.1; 165/40, 119, 76–79, 5, 59, 95,
  11.1; 55/96, 97, 125, 35, 482, 385.6, 274

[56] References Cited

U.S. PATENT DOCUMENTS

| | | | |
|---|---|---|---|
| 3,201,772 | 8/1965 | Ladusaw | 340/607 |
| 3,925,710 | 12/1975 | Ekert | 361/384 |
| 3,971,877 | 7/1976 | Lee | 174/16.1 |
| 4,240,072 | 12/1980 | Fowler | 340/664 |
| 4,726,825 | 2/1988 | Natale | 55/350 |
| 4,889,542 | 12/1989 | Hayes | 361/384 |
| 4,946,480 | 8/1990 | Hauville | 55/270 |
| 4,963,170 | 10/1990 | Weber | 55/311 |

FOREIGN PATENT DOCUMENTS 0162960 12/1984 Fed. Rep. of Germany.
8621144 11/1986 Fed. Rep. of Germany.
8714894 2/1988 Fed. Rep. of Germany.

OTHER PUBLICATIONS

Haldeman, *Fast Bus Rack Alarms and Limits*, IEE Transactions on Nuclear Science, vol. 33, No. 1, Feb. 1986, N.Y., pp. 838–840.

*Primary Examiner*—Gerald P. Tolin
*Attorney, Agent, or Firm*—Wolf, Greenfield & Sacks

[57] ABSTRACT

In order to replace a dirty filter in a cabinet, the clean filter is introduced in an upper slot of the cabinet until it comes in contact with the paddle of switch. The clean filter is thus superposed on the dirty filter, and the dirty filter is retracted through the lower slot of the cabinet. The replacement of the filter is done without stopping the machine.

31 Claims, 3 Drawing Sheets

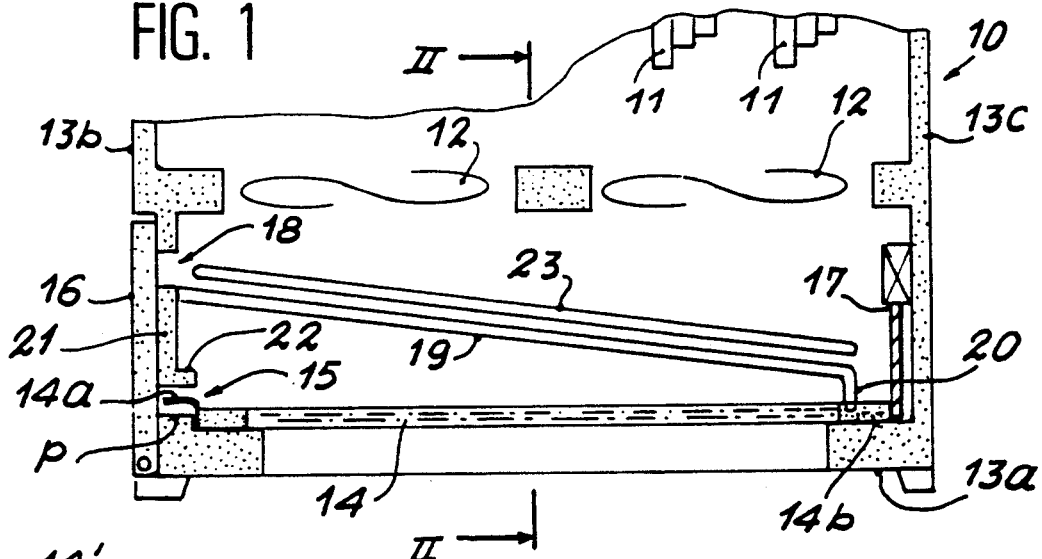
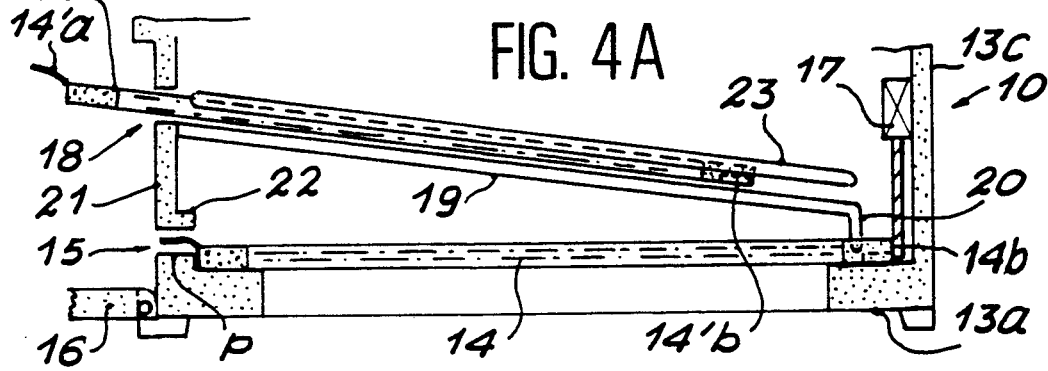
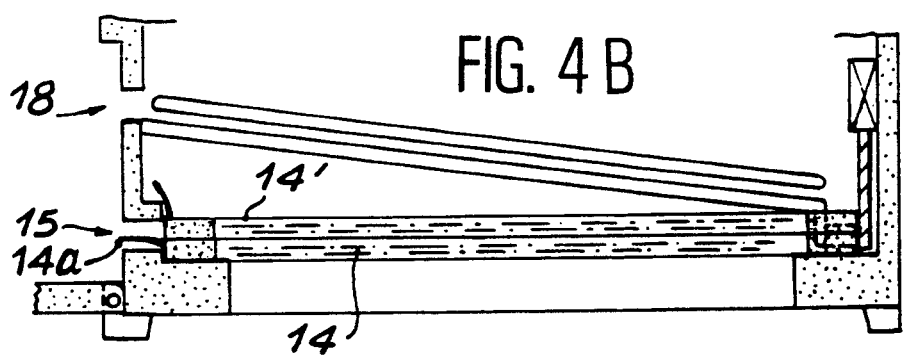
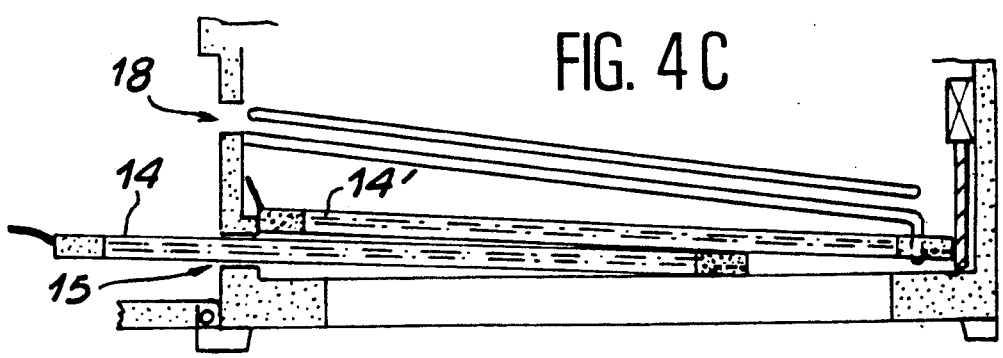

CABINET FOR A MACHINE COOLED BY VENTILATION

BACKGROUND OF THE INVENTION

1. Field of the Invention

The present invention relates generally to a cabinet for a machine cooled by ventilation, the cabinet containing an air filter held in contact with a filter-presence detection device so that the machine is stopped if the air filter is removed. More particularly, the invention concerns cabinets enclosing machines with high thermal dissipation, such as computers used in medium and large size information processing systems.

2. Discussion of the Prior Art

A machine air filter is ordinarily made of a grid supported by a frame. The air filter is generally inserted into the machine cabinet by sliding on guides at the base of the cabinet parallel to the floor. The air filter is designed to stop dust and foreign objects that could be aspirated by the fans and then circulated within the machine. The dust and objects may interfere with the normal functioning of the machine and may in fact damage the machine. In a computing system especially, the accumulation of dust on the electrical components and their interconnection elements changes the desired quality of cooling and of the electrical insulation. The presence of the filter is important and it is thus monitored continuously by a detector, usually a switch actuated by the fastening edge of the filter when the filter is correctly installed in the machine.

Using air filters poses a maintenance problem. Normally, the filter will have to be changed periodically. To determine when the filter needs to be changed, the vacuum created by the fans is monitored. When a signal corresponding to the vacuum drops below a critical threshold, indicating that the air flow has dropped below the minimum airflow needed for proper operation of the machine, a signal is generated signaling that the air filter needs changing. However, since removal of the filter activates the presence detector which in turn stops the machine, it is generally best to stop the machine in a controlled manner in order to change the filter. Stopping and restarting a computer and returning it to its normal operating state are in fact operations that are very troublesome and expensive if the computers are turned off simply to change a filter. In practice therefore, the filter is thus changed sooner or later than it should be. While the machine is stopped, a part of the dust set into vibration at the time the filter is removed, due to the mechanical removal of the filter, is attracted by electrostatic effects towards the electrical components in the computer and their supports. The dust may, in the long run, adversely affect cooling or the electrical insulation. Another significant portion of the dust falls onto the floor. This dust is aspirated when the machine is started up again and partially fouls the new filter. Another drawback of the prior art filters and machine cabinets is that maintenance cannot be done without stopping the machine. This considerably aggravate the problem of replacing the filter.

Certain conditions of the machine usage create other problems. For example, there are certain countries which have regulations requiring that a metal plate be placed permanently under components that are easily inflammable or apt to emit noxious fumes when there is a fire. The remedy used actually consists of placing a metallic plate that is massive, cumbersome, and unaesthetic below the machine. Furthermore, it is difficult to put the metallic plate in place. It is necessary to place the machine at the desired location and to mount it on jacks in order to position it in the proper relationship to the floor and the plate.

The present invention solves these prior art problems with a simple, efficient, and inexpensive apparatus.

SUMMARY OF THE INVENTION

According to the invention, there is provided a cabinet for a machine cooled by ventilation, the cabinet containing an air filter held in contact with a filter-presence detection device, the detection device indicating the presence or absence of the filter. The cabinet contains means to superpose on the filter a second like filter and means to maintain the detection device in a state indicating that an air filter is present in the presence of a second filter, independent of the presence of the first filter.

The characteristics and advantages of the invention will be appreciated from the description that follows, which is given by way of example only and should be read in conjunction with the attached drawings.

BRIEF DESCRIPTION OF THE DRAWINGS

In the Drawings,

FIG. 1 illustrates, in cross section, along line I—I of FIG. 2, which corresponds to the median plane perpendicular to the front and rear faces of the cabinet, the lower part of a cabinet of the present invention for a computer cooled by ventilation;

FIGS. 4A–4C are cross sectional views along the same line as shown in FIG. 1, illustrating various steps in the process of replacing the air filter in the cabinet of the present invention illustrated in FIGS. 1 and 2;

DETAILED DESCRIPTION

Figure 2:
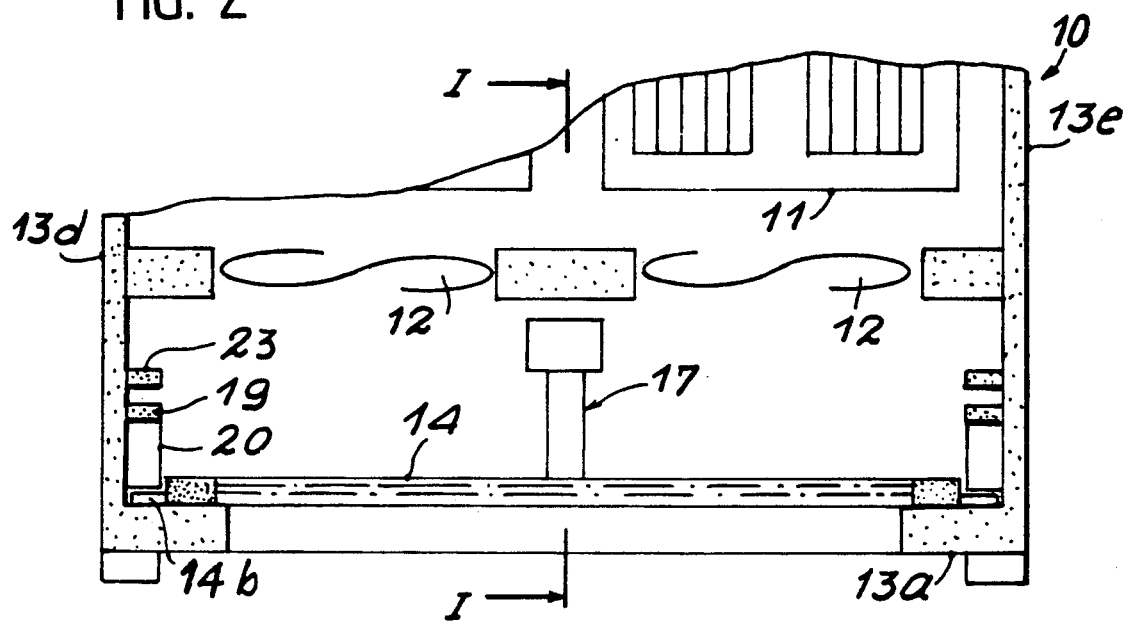
FIG. 2 is a cross section along the line II—II of FIG. 1, which corresponds to the median plane parallel to the front and rear faces of the bottom part of the cabinet represented in FIG. 1.
Figure 3:
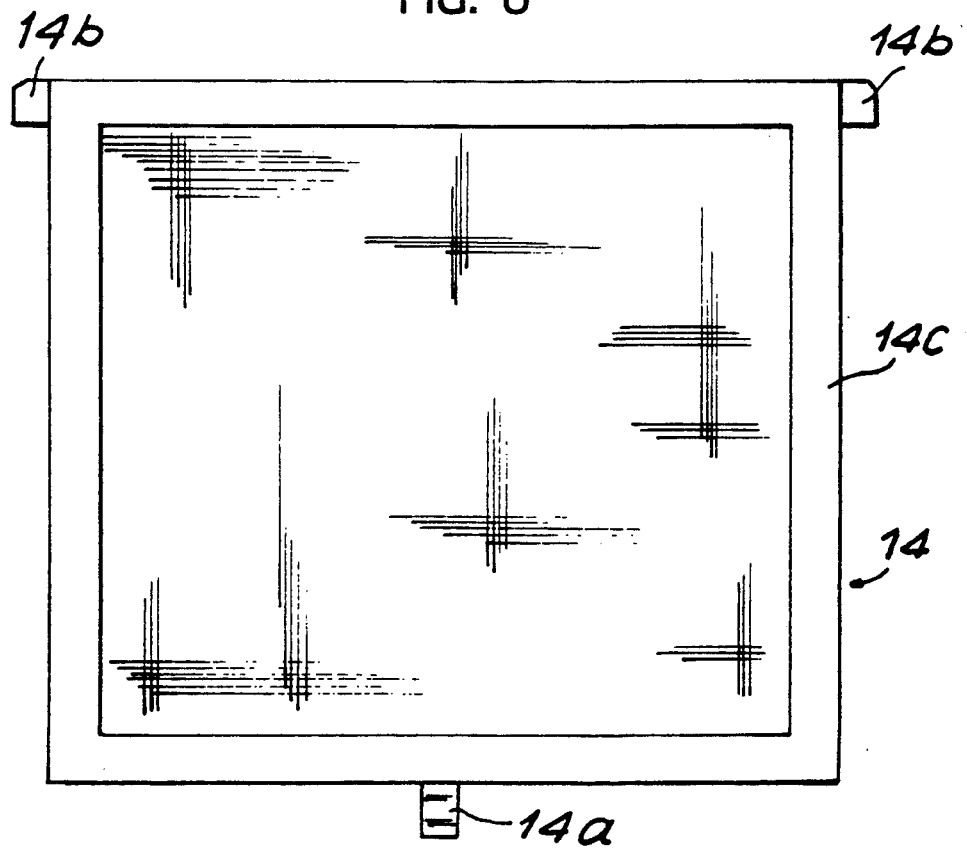
FIG. 3 is a plan view of the air filter illustrated in FIGS. 1 and 2.

FIGS. 1 and 2 illustrate schematically the lower part of a computer cabinet 10 of the invention. The invention has been applied to a cabinet for a large information processing system. In the drawings, the elements of the cabinet 10 have been enlarged in various ways to show them clearly. In the cabinet 10, the components 11 are essentially interconnection cards for integrated circuits having heat sinks for cooling. Fans 12 are disposed in the lower part of the cabinet 10 to ventilate the heat sinks with air aspirated across the wall 13a of the base of cabinet 10. The bottom wall 13a is a frame usually having one or two essentially rectangular windows for the intake of ventilation air. The frame 13a illustrated in FIG. 1 has a single window. Each window is covered by an air filter 14 parallel to the floor which the cabinet sits on, and is supported by the frame 13a of the bottom of cabinet 10. The filter 14 used in the cabinet 10 illustrated in FIG. 1 is shown in cross section in FIGS. 1 and 2 and in a plan view in FIG. 3. The filter usually incorporates a rigid metallic frame 14c on which is supported the air filtering grid. One edge of the filter 14 has a flexible tongue 14a as shown in FIG. 3. As shown in FIG. 1, a slot 15 in the front wall 13b of the cabinet 10 permits the insertion or retraction of filter 14. Slot 15 has essentially the same size and thickness dimensions as the filter 14. In the example illustrated in FIG. 1, the lower edge of the slot 15 coincides with the front edge of the upper face of the frame of the bottom wall 13a of cabinet 10. In addition, the front edge of the frame 13a forms a bearing p raised in relationship to the top surface of the frame assembly 13a. A shutter 16 that can be lowered assures the closure of slot 15 during normal operation of the machine. On the rear wall 13c of cabinet 10, there is mounted a detection device 17 for detecting the presence of filter 14. The detection device illustrated is a paddle switch actuated perpendicularly to the rear wall 13c. This switch structure is well known in current cabinets.

In a prior art cabinet as described above, the installation of the filter 14 is as follows. The filter 14 is introduced through the slot 15. The filter eventually comes in contact with the paddle of switch 17 to bring it into a final position indicating the presence of the filter and its correct positioning. In this final, correct position, the filter 14 is lodged in the reinforcement of the frame of the bottom wall 13a. The filter is supported against the bearing p and, at the rear, against the paddle of switch 17. Switch 17 thus assures correct positioning of filter 14 in cabinet 10 and empower the normal functioning of the machine. In order to remove the filter, the shutter 16 is opened and the tongue 14a of the filter 14 is pulled. The paddle of switch 17 relaxes into a position representative of an incorrect positioning of the filter. The switch 17 then shuts the machine off.

The present invention includes a cabinet structure permitting the replacement of filter 14 without shutting off the machine. In the example illustrated in FIGS. 1 and 2, the front wall 13b of cabinet 10 includes an upper slot 18 parallel to and identical to the lower slot 15. The lateral walls 13d and 13e (as shown in FIG. 2) of the cabinet 10 each have a guide 19 extending from the upper slot 18 to a position close to the paddle of the switch 17. The guides 19 are adapted to fit two tabs 14b of filter 14 located respectively on the two lateral edges of the frame of filter 14, as shown in FIG. 3. In the example illustrated, the two tabs 14b are located at the end opposite the edge of the filter 14 having the tongue 14a and are co-planar with the interior face of filter 14. The thickness of the tabs 14b is considerably less than the thickness of the filter frame 14c. Towards the rear of cabinet 10, the guides 19 extend to form the portion 20 extending in a plane essentially parallel to the paddle of switch 17 when switch 17 is in the position representative of the correct position of the filter 14 in the cabinet 10. The distance between the plane of the portion 20 and the paddle of the switch 17 corresponds to the size of the tabs 14b of filter 14 when the filter is in the final engagement position in the cabinet 10. Portion 20 terminates above the bottom of the cabinet at a position essentially corresponding to the thickness of tabs 14b of filter 14 when it is resting on the bottom wall 13a of cabinet 10. Slots 15 and 18 are separated by a member 21 of the front wall 13b of the cabinet 10. In the example illustrated, the lower part of the member 21 is extended by a flange 22 parallel to the bottom wall 13a of cabinet 10. The length of flange 22 is approximately equal to the length of bearing p. In the example illustrated, the flange 22 is extended slightly towards the upper slot 18. The shutter 16 closes the slots 15 and 18 during normal operation of the machine. The cabinet 10 has projections 23 disposed on its lateral walls 13d and 13e above the guides 19 and, in the example illustrated, parallel to guides 19.

It is now assumed that the filter 14 in place on the bottom wall 13a of the cabinet 10 of the present invention is dirty and must be replaced. Shutter 16 is opened to gain access to slots 15 and 18. Via the upper slot 18 the clean filter 14' is introduced in such a way that its tabs 14'b slide on guides 19 (FIG. 4A). The projections 23 serve as the upper limits to the highest admissible position of the clean filter 14', to avoid, for example, contact with the blades of fan 12. The filter 14' slides along guides 19 until it comes in contact with the paddle of switch 17. In this position, the front edges of tabs 14'b are guided by portion 20. The tongue 14'b of the new filter is released. The new filter 14' then drops by gravity, while being guided by the portion 20 to rest in contact with the paddle of switch 17. The new filter 14' thus places itself against the dirty filter 14 (FIG. 4B). Via the lower slot 15, the tongue 14a is pulled to extract the dirty filter 14. In the course of removal (FIG. 4C), the new filter 14' progressively takes the place of filter 14. Due to stop 22, the new filter remains in contact with the paddle of switch 17 until the new filter is finally set in place. The replacement of air filter 14 is accomplished without interrupting the continuous function of the machine in cabinet 10. If the filtering grid of filters 14 and 14' is metallic, the invention also offers the advantage of assuring the continuous presence of a metallic bottom wall of cabinet 10 in order to conform to the prescribed regulations.

Figure 5A:
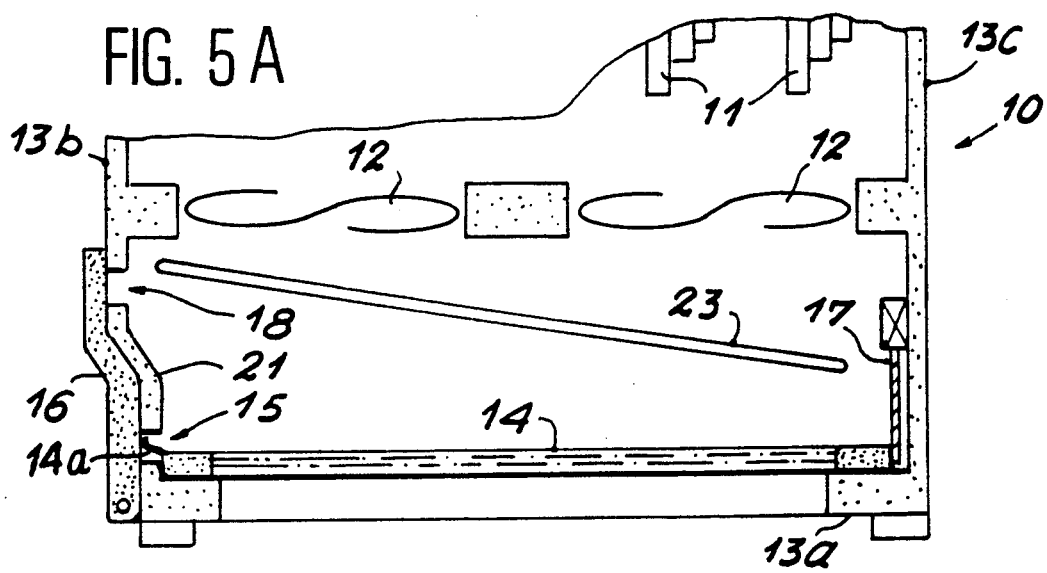
FIG. 5A is a cross sectional view similar to FIG. 1 illustrating an alternative embodiment of the machine cabinet of the present invention.

FIG. 5A illustrates, in a similar way to FIG. 1, an alternative embodiment of the bottom part of a computer cabinet 10 conforming to the present invention. The common elements in cabinets 10 illustrated in FIGS. 1 and 5A have the same reference numbers. The cabinets 10 represented in FIGS. 1 and 5A have in common, according to the invention, the upper slot 18, the shutter 16, and the projections 23. According to the alternative embodiment illustrated in FIGS. 5A–5D, the air filters do not have tabs 14b and the cabinet 10 does not have guides 19 and portion 20, and the lower slot 15 does not have a bearing p and its associated flange 22. In FIG. 5A, the slot 15 emerges directly on the upper face of the bottom wall 13a of cabinet 10, without the intermediary of bearing p. The front wall 13b has the upper slot 18 and the member 21 curved in towards the rear wall to join slot 15. Slot 15 is then closer to the rear wall 13c than the upper slot 18.

Figure 5B:
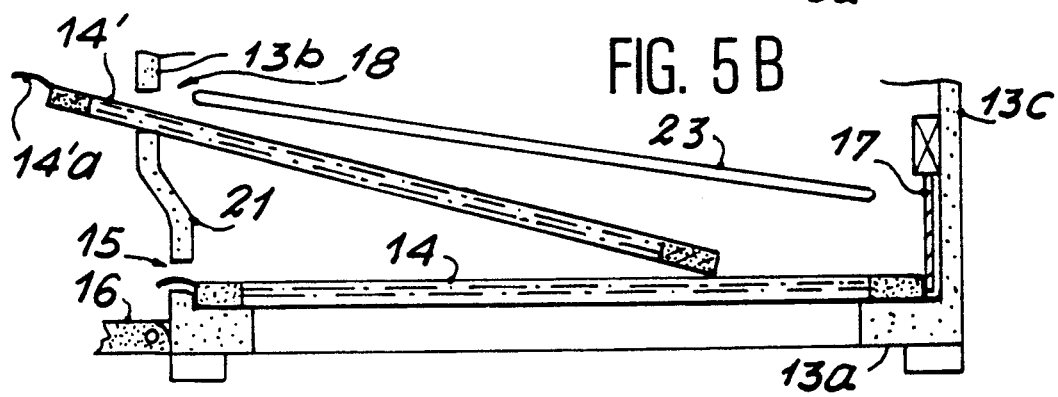
FIGS. 5B–5D illustrate various steps in the process of replacing the air filter in the cabinet illustrated in FIG. 5A.
Figure 5C:
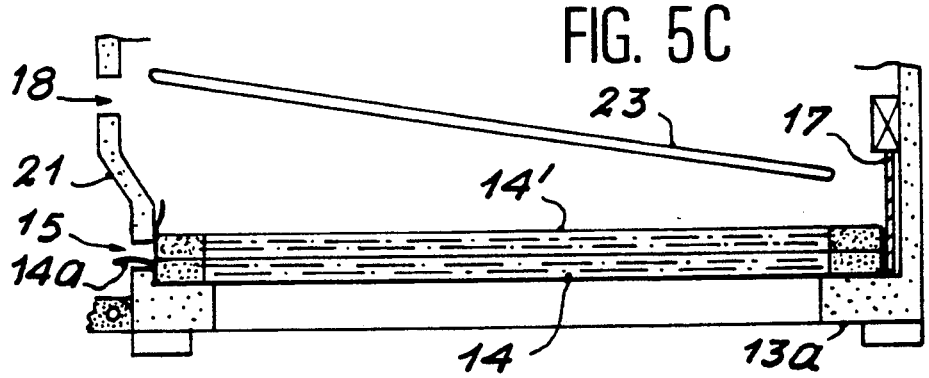
Figure 5D:
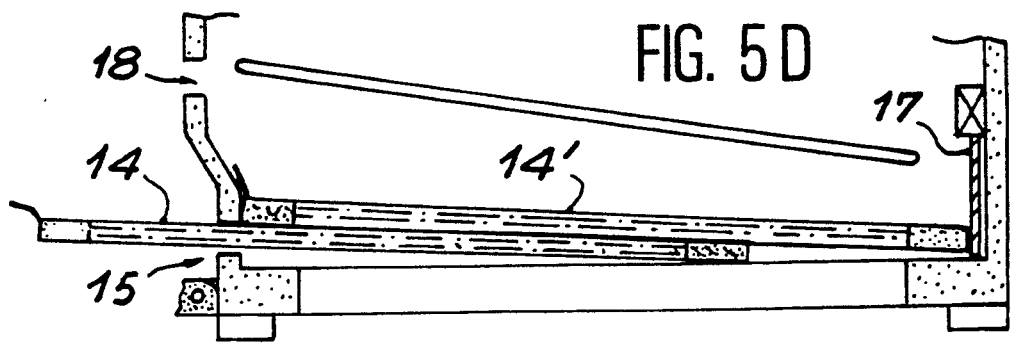

The replacement of filter 14 in cabinet 10 represented in FIG. 5A will now be described with reference to FIGS. 5B–5D illustrating various steps analogous to those in FIGS. 4A–4C, respectively. As indicated in FIG. 5B, the new filter 14' is introduced through the upper slot 18 and slides on the upper surface 14c of the lateral edges of the filter 14 which is being replaced. After it is introduced, the tongue 14'b is released in such a way that the new filter 14' will lie on top of the dirty filter 14 (FIG. 5C). During its descent, the new filter 14' is guided by member 21 of the wall 13a disposed between slots 15 and 18. In removing the dirty filter 14 via slot 15, the new filter progressively goes into place (FIG. 5D). Due to the stop formed by the base of member 21, the new filter 14' remains in contact with the paddle of the switch 17. Finally, the new filter 14' takes its final position, replacing the filter 14 as shown in FIG. 5A. The shutter 16 is then lowered to close slots 15 and 18. FIGS. 5A-5D then show that, on the one hand, the upper face 14c of filter 14 serves as a guide for filter 14' and replaces the guides 19 of the cabinet 10 illustrated in FIGS. 1 and 2 and, on the other hand, the shape of the member 21 has the same function as the portions 20 and the flange 22 of the cabinet 10 illustrated in FIGS. 1 and 2. Because of its simplicity, the cabinet 10 shown in FIG. 5A is the preferred embodiment of the invention.

The invention clearly has other alternative embodiments. For example, the switch 17 can be designed to indicate only the presence of filter 14, instead of the correct position of the filter as in the examples shown. The switch 17 could be of a type without a paddle. In this case, in the examples illustrated, most generally the term "status", representative of the presence of the filter corresponds to the term "position of the paddle", and if necessary, to the correct position of the filter. In addition, the member 21 in the cabinet 10 of the FIG. 5A could also be straight, like the member 21 of the cabinet 10 of FIGS. 1 and 2. The slot 18 could also be placed below the slot 15.

What is claimed is:

1. A cabinet for a computing machine, including a first air filter held in contact with a detection device, said detection device having a status representative of the presence of the filter in contact therewith, a second filter, means to superpose on the first air filter said second air filter, said second air filter being substantially like said first air filter for replacement thereof and means for causing contact of said second air filter with said detection device before removal of said first air filter, thereby maintaining the detection device in the status indicating that a filter is present.

2. A cabinet according to claim 1 containing a first slot in a wall of the cabinet for the passage of the first filter, wherein the means for superpositioning the second filter comprises a second slot for the passage of the second filter.

3. A cabinet according to claim 2, wherein the second slot is placed above the first slot.

4. A cabinet according to claims 2 or 3, wherein the second slot is connected to guides for guiding introduction of the second filter.

5. A cabinet according to claim 1, wherein the first filter includes lateral edges having upper faces that serve as guides for placement of the second filter.

6. A cabinet according to claim 5, wherein the second filter has side tabs attached thereto and the guides comprise portions for guiding the side tabs of the second filter.

7. A cabinet according to claim 6 further comprising an upper flange disposed above the first slot, and in alignment with a bearing, said upper flange and said bearing having the same dimensions.

8. A cabinet according to claim 2 further comprising a member separating the first and second slots, said member having an indentation for superposing the second filter on the first filter and for wedging said second filter between said member and the detection device and for maintaining the second filter in a superposed on the first filter during removal of the first filter through the first slot.

9. A cabinet according to claim 1, wherein the filters are metal filters.

10. A cabinet according to claim 1, wherein the detection device comprises a switch with a paddle.

11. A cabinet for a computing machine, having an air filter held in contact with a detection device that assumes a state representative of the presence of the filter in contact therewith, a clean filter, means for receiving said clean filter for positioning in the cabinet adjacent said previously disposed filter and said clean filter positioned in contact with the detection device to maintain the detection device in its filter present state, and means for enabling removal of the previously disposed filter after the clean filter is positioned in contact with the detection device to maintain the detection device in its filter present state.

12. A cabinet according to claim 1, wherein said cabinet has a first slot for accommodating the removal of the previously disposed filter and a second slot for receiving the clean filter.

13. A cabinet according to claim 12, wherein the second slot is placed above the first slot.

14. A cabinet according to claim 13, further including guide means associated with the second slot for guiding introduction of the clean filter.

15. A cabinet according to claim 11, wherein the previously disposed filter includes lateral edges having upper faces that serve as guides for placement of the clean filter.

16. A cabinet according to claim 15, wherein the clean filter has side tabs attached thereto and the guides comprise portions for guiding the side tabs of the clean filter.

17. A cabinet according to claim 12, further comprising an upper flange disposed above the first slot, and in alignment with a bearing, said upper flange and said bearing having the same dimensions.

18. A cabinet according to claim 12 further comprising a member separating the first and second slots, said member having an indentation such that the clean filter will superpose itself on the previously disposed filter while being wedged between said member and the detection device and remain in a superposed position during removal of the previously disposed filter through the first slot.

19. A cabinet according to claim 11, wherein the filters are metal filters.

20. A cabinet according to claim 11, wherein the detection device comprises a switch with a paddle.

21. A method of replacing filters in a cabinet of a computing machine comprising the steps of providing a filter present detector having a filter present state assumed when in contact with a filter, providing a first filter at the base of the cabinet in contact with said filter present detector for filtering air introduced through the base, inserting a second clean filter before removing said first filter when it becomes dirty, said second clean filter being inserted into the cabinet adjacent to said first filter and positioned in contact with said filter present detector to maintain the filter present detector in its filter present state, and subsequently removing said first filter.

22. A method as set forth in claim 21, wherein the second clean filter is inserted in a position over the first filter.

23. A cabinet for a computing machine comprising:
 a filter detection device,
 a first air filter held in contact with said detection device which assumes a state representative of the presence of the filter in contact therewith, a second air filter, means for receiving said second air filter, substantially like said first air filter for replacement thereof, and for positioning said second air filter in the cabinet adjacent said first air filter, said means for receiving including a member supporting the second filter in superposed relative relation to the previously disposed filter.

24. A cabinet according to claim 23 wherein said second filter includes a member for wedging the second filter between said member and the detection device.

25. A cabinet according to claim 24 wherein said cabinet has a first slot in a wall thereof for the withdrawal of the first filter, and a second slot for the passage of the second filter into the cabinet.

26. A cabinet according to claim 25 further including guide means associated with the second slot for guiding introduction for the second filter.

27. A cabinet according to claim 23 wherein the first air filter includes lateral edges having upper faces that serve as guides for placement of the second air filter.

28. A cabinet according to claim 27 wherein the second filter has side tabs attached thereto and the guides comprise portions for guiding the side tabs of the second filter.

29. A cabinet according to claim 25 wherein said member is disposed between said first and second slots.

30. A cabinet according to claim 23 wherein the filters are metal filters.

31. A cabinet according to claim 23 wherein the detection device comprises a switch with a paddle.

* * * * *